United States Patent
Yew et al.

(10) Patent No.: US 7,884,464 B2
(45) Date of Patent: Feb. 8, 2011

(54) 3D ELECTRONIC PACKAGING STRUCTURE HAVING A CONDUCTIVE SUPPORT SUBSTRATE

(75) Inventors: Ming-Chih Yew, Hsinchu (TW); Chang-Ann Yuan, Kaohsiung (TW); Chan-Yen Chou, Wufong Township, Taichung County (TW); Kou-Ning Chiang, Hsinchu (TW)

(73) Assignee: Advanced Chip Engineering Technologies Inc., Hsinchu (TW)

( * ) Notice: Subject to any disclaimer, the term of this patent is extended or adjusted under 35 U.S.C. 154(b) by 972 days.

(21) Appl. No.: 11/475,131

(22) Filed: Jun. 27, 2006

(65) Prior Publication Data

US 2007/0296065 A1    Dec. 27, 2007

(51) Int. Cl.
*H01L 23/04* (2006.01)

(52) U.S. Cl. .................. 257/698; 257/686; 257/691; 257/773; 257/783; 257/E23.079

(58) Field of Classification Search .................. 257/685, 257/686, 723, 777, E25.005, E25.006, E25.031, 257/E25.032, E23.042, E23.085, E21.027, 257/691, 698, 678–733, 773–776, E23.001–E23.194
See application file for complete search history.

(56) References Cited

U.S. PATENT DOCUMENTS 7,084,513 B2 *   8/2006   Matsuki et al. ............. 257/777
7,365,416 B2 *   4/2008   Kawabata et al. ........... 257/686

\* cited by examiner

*Primary Examiner*—Jasmine J Clark
(74) *Attorney, Agent, or Firm*—Muncy, Geissler, Olds & Lowe, PLLC (57) ABSTRACT

The present invention provides a 3D electronic packaging unit having a conductive supporting substrate that can achieve multi-chip stacking through the signal contacts on the both sides of the unit. The packaging unit can be batched manufactured on wafers or substrates, and thus reduce the manufacturing cost of each individual packaging unit; moreover, the conductive supporting substrate can be utilized to provide signal transmission of the electronic elements, and the supporting substrate can be used as a ground terminal for the carried electronic elements to enhance electric performance of the electronic elements. The supporting substrate is also a good thermal conductor that can release effectively heat energy generated by the electronic elements and accumulated inside the package to the outside of the package along the substrate to enhance reliability of the packaging structure.

21 Claims, 6 Drawing Sheets

3D ELECTRONIC PACKAGING STRUCTURE HAVING A CONDUCTIVE SUPPORT SUBSTRATE

FIELD OF THE INVENTION

The present invention relates to electronic packaging structures, and more particularly to a packaging unit having a conductive supporting substrate that can achieve multi-chip stacking through signal contacts on the both sides of the unit.

BACKGROUND OF THE INVENTION

As the demand for functions and applications of electronic products increases rapidly, packaging technology has continued to advance toward super high density, miniature, and from single chip to multi-chip, 2D to 3D scale. Consequently, there are advanced packaging structures (i.e. super high density packaging forms) at present, such as wafer level package, 3D package, multi-chip package, and System In Package (SIP), which are distinctly different from conventional packaging in the design, manufacture, and material use. The most ideal situation is to accommodate all circuits in a single silicon chip which is System-on-Chip (SoC). However, besides technical difficulties, integrating ever-complicated circuit functions into a single chip will enlarge the chip size, complicate the chip-making process, and causes reduced yield and increased cost. Therefore, compared with SoC technology, SIP which emphasizes small size, high frequency, high speed, short production cycle, and low cost is the preferred method to realize the above goals and integrate chips with various circuit functions. Based on the requirements of different applications, packaging can be categorized into planar Multi-Chip Module (MCM), Multi-Chip Package (MCP), and 3D stacked packaging structure having multichips which reduce packaging areas more effectively and further use thin chips to cut both the thickness and weight of the stacked package. Hence, the requirement of lightness, thinness, and shortness for advanced packaging structures can be accomplished.

Figure 1:
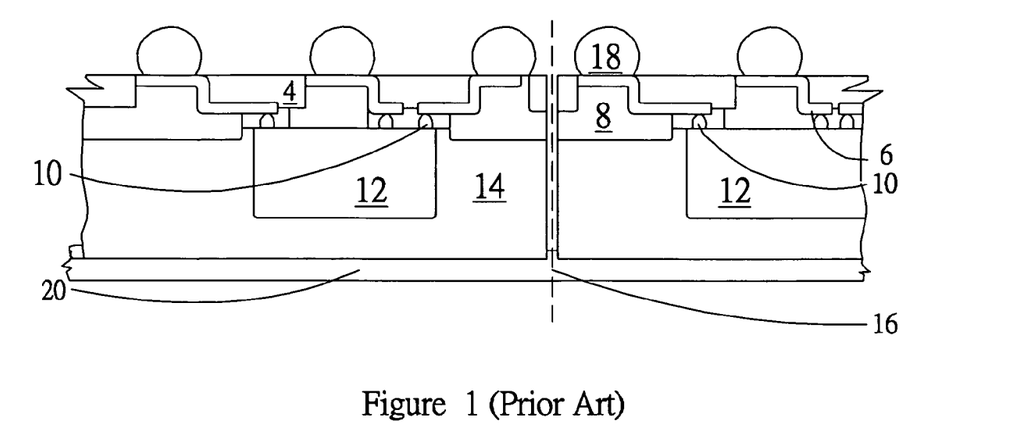
FIG. 1 is a fan-out wafer-level packaging structure of a prior art.

A fan-out wafer-level packaging structure and process thereof are disclosed in Taiwan Patent No. 5,431,255, as shown in FIG. 1, wherein a molding material 14 is on the both sides and the bottom of a chip 12, a dielectric layer pattern 8 that is used to define the structure of a conductive layer 6 is distributed over the chip 12 and the packaging materials 14, and a protective masking layer 4 is coated on the surface of the package. A first conductive bump 10 can reach a second conductive bump 18 through the conductive layer in the above structure to achieve I/O fan out. Further, a manufacturing method for the above packaging structure is also disclosed in the patent. The method comprises: 1) a masking layer (carrier) is coated on a substrate; 2) the masking layer is patterned to expose a portion of the substrate, and a conductive pattern is formed on a part of the masking layer pattern and the exposed substrate; 3) a dielectric layer pattern is formed on the masking layer and on the conductive layer pattern, and a portion of the above conductive layer pattern is exposed; 4) the chip is connected to the above exposed conductive layer pattern using the first conductive bump to form signal connection; 5) the packaging materials is formed on the above chip, and the above substrate is removed after; and 6) the second conductive bump is formed and located on the above exposed conductive pattern, and the packaging units are cut and separated. The patent provides a wafer-level packaging structure having I/O fan-out characteristic; however, the packaging structure does not have stacking characteristic and is unable to meet the requirement of SIP technology.

Figure 2:
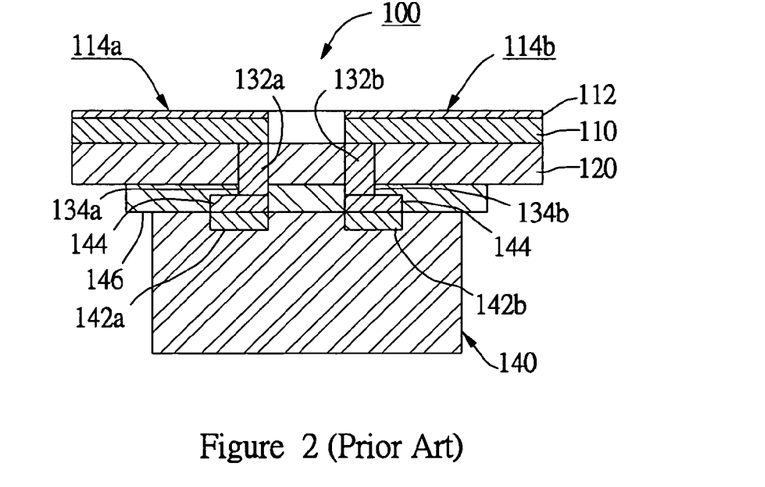
FIG. 2 is an electronic packaging structure of a prior art using a patterned metal layer to achieve I/O fan-out characteristic.

An electronic packaging structure using a patterned metal layer to achieve I/O fan-out characteristic is disclosed in U.S. Pat. No. 6,288,905, referring to FIG. 2. This packaging structure comprises: a patterned metal layer 110, a thermoplastic or thermosetting dielectric layer 120, via holes 130 and conductive materials 132 filled inside the holes 130, bottom packaging materials 146, and an electronic element 140. Signal transmission of the electronic element of the patent can reach the surface patterned metal layer of the packaging structure through the above conductive via holes; the patterned metal layer also provides a support for the packaging structure in the manufacturing process. However, this packaging structure does not have the stacking characteristic, either; moreover, there are dielectric materials besides via holes between the electronic element and the metal layer, and thus it is not easy to release heat energy generated by the electronic element to the outside of the package along this path.

Accordingly, as system-on-chip (SoC) package is becoming a trend to manufacture multiple chips, such as microelectronics, high frequency communication or actuating sensors, and to reduce the technology cost of stacked packaging and to achieve packaging volume miniaturization, it is a pressing issue to develop a high-density, highly reliable structure and electrical properties, and to design and assemble a packaging structure with multi-microelectronic elements which can make flexible adjustment depending on required application functions.

SUMMARY OF THE INVENTION

In the light of the above drawbacks in the prior art, and system-on-chip (SoC) package is becoming a trend to manufacture multiple chips, such as microelectronics, high frequency communication or actuating sensors, the objects of the present invention will be shown as follows:

The present invention proposes an electronic packaging structure, and the object is to provide a wafer-level packaging unit with multiple microelectronic elements, wherein the conductive trace patterns on the top and bottom surfaces can perform flexibly a single or multiple miniaturized stacked packaging structure depending on the requirements of application circumstances and functions to reduce the signal transmission paths and time, and thereby enhance the working frequency and efficiency of the stacked packaging module.

Another object of the invention is to provide an electronic packaging structure, wherein all packaging units are batch manufactured on the wafers or substrates, and thus reduce the manufacturing cost of each individual packaging unit.

Still another object of the invention is to provide an electronic packaging structure, wherein the conductive supporting substrate is utilized to provide signal transmission for the electronic elements, and the supporting substrate can be used as a ground terminal for the carried electronic elements to enhance electrical characteristic of the electronic elements. Further, the supporting substrate is also a good thermal conductor that can release effectively heat energy generated by the electronic elements and accumulated inside the package to the outside of the package along the substrate, and thus enhance reliability of the packaging structure.

To accomplish the above discussed objects, the proposed electronic packaging structure of the invention comprises a single or multiple conductive supporting substrates. A single or multiple electronic elements are distributed over the surfaces of the above supporting substrates, and the areas of the supporting substrates may be greater than, equal to, or smaller than those of the electronic elements. A single or multiple filling zones are formed around the above electronic elements, there is a single or multiple via holes within the filling zones, and conductive materials are filled inside the via holes or hole walls to form signal connection between the surfaces of the filling zones and the above substrates. A single or multiple signal contacts are formed on at least one side of the above electronic packaging structure, and the surface areas of the signal contacts may be greater than, equal to, or smaller than those of the electronic elements. A single or multiple signal channels are formed on at least one side of the above electronic packaging structure, and are connected to the above signal contacts respectively to form channels between the signal channels and inner circuits of the above electronic elements. Multiple fixation structures (UBM: under bump metallurgy) are formed on the above signal contacts.

The aforementioned objects, features, and advantages will become apparent from the following detailed description of a preferred embodiment taken together with the accompanying drawings.

BRIEF DESCRIPTION OF THE DRAWINGS

The preferred embodiments of the invention will be illustrated further in the following description and accompanying drawings, and wherein.

DETAILED DESCRIPTION OF A PREFERRED EMBODIMENT

An electronic packaging structure is disclosed in the present invention. More specifically, the invention provides a packaging unit having a conductive supporting substrate that can achieve multi-chip stacking through the signal contacts on the both sides of the unit. The embodiments of the invention are described in detailed below, and the preferred embodiment is for illustration only and not for purposes of limiting the invention.

Figure 3A:
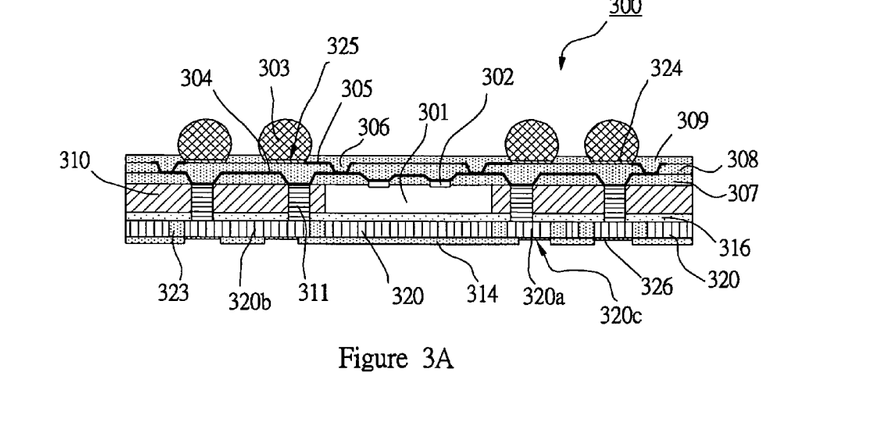
FIG. 3A is a first embodiment of the invention, and a cross-sectional diagram of the packaging unit of the present invention.

FIG. 3A is a cross-sectional diagram of the packaging unit according to the present invention. A first packaging unit 300 employs a conductive supporting substrate 320 as a structure frame, and the material of the conductive supporting substrate 320 can be Cu, Ni, Fe, Al, Co, Au, or the alloys of the above metal materials, or the combinations of other types of conductive materials. On the conductive supporting substrate 320, a first electronic element 301 is connected thereon using an adhesive layer 316, and the electronic element can be selected from an active electronic element, a passive electronic element, a sensing element, a testing element, a micro-electro-mechanical (MEM) chip, or the combinations of the above electronic elements. Fillers 310 are filled around the first electronic element 301, and the fillers 310 can be made of thermoplastic to thermosetting materials, and their upper surfaces are close to that of the first electronic element 301. Second via holes 311 are within the filling zone, and the conductive materials are filled inside the holes and the hole walls to form signal connection between the surfaces of the fillers 310 and the above conductive supporting substrate 320. The conductive material filled inside the second via holes 311 can be Sn, Ag, Au, Al, Be, Cu, Ni, Rh, W, or the alloys of the above metal materials or the combinations of other types of conductive materials. The surface leveling is provided by a first cover layer 307, and circuit signals of contact pads 302 are redistributed by a first inner conductive layer 304 by employing the method of sputtering, electroplating, or other suitable methods. Circuit signals inside the first electronic element 301 are coupled to the above second via holes 311 through the first inner conductive layer 304, and are also coupled to first via holes 306 defined by a second cover layer 308 to transmit signals to a second inner conductive layer 305. Signals transmitted by the first via holes 306 are redistributed by the second inner conductive layer 305; a first circuit protection layer 309 is on the upper surfaces of the second inner conductive layer 305 and the second cover layer 308 to protect the second inner conductive layer 305 and to form a fourth signal contact 325 on the upper surface of the first packaging unit 300.

The above supporting substrate 320 of the first packaging unit 300 is conductive, therefore a first signal channel 320a can be defined on the supporting substrate 320, and a second signal channel 320b can be defined on the lower surface of the packaging structure. An insulating layer 323 can be filled between the signal channels to isolate the different circuit signals, and a first signal contact 320c is defined by a second circuit protection layer 314 to be on the lower surface of the first packaging unit 300. It is known from the above description there can be a single or multiple signal contacts 320c, 325 formed on a single side or both sides of the electronic packaging structure, and the distributed surface areas of the signal contacts can be greater than the upper surface area of the above first electronic element 301 to achieve I/O fan out. A first and second signal contact protection layers 324, 326 can be coated on the above first signal contact 320c or on the fourth signal contact 325 as a signal protective material before stacking of the first packaging unit 300. Signal transmission fixation structures 303 (UBM: under bump metallurgy) are formed on the above signal contact protection layers 324, 326 to connect circuit signals between the first packaging unit 300 and other electronic devices.

A possible manufacturing process for the above first packaging unit 300 includes a step of fixing the back of the first electronic element 301 on the conductive supporting substrate 320. The next step is to form the fillers 310 by screen printing, stencil printing, cylinder coating, inkjet coating, lamination, lithography, or other suitable methods. Subsequently, the second via holes 311 are defined within the fillers 310 by employing machine drilling, laser drilling, dry/wet etching, or other suitable methods, and the conductive materials are filled inside the holes or the hole walls. The first signal channel 320a and the second signal channel 320b are formed on the supporting substrate 320 by machining, dry etching, wet etching, laser drilling, or other suitable methods, and the insulating layer 323 is filled between the signal channels to isolate the different circuit signals. Then by screen printing, stencil printing, lithography, or other suitable methods, the second circuit protection layer 314 is formed and the location of the first signal contact 320c is defined.

The first cover layer 307, the first inner conductive layer 304, the second cover layer 308, and the second inner conductive layer 305 are formed in sequence through a patterning process. Then, the first circuit protection layer 309 is formed by screen printing, stencil printing, lithography, or other suitable methods, and the fourth signal contact 325 is defined by the corresponding position of the first signal contact 320c. Finally, the second signal contact protection layer 326 is formed on the upper surface of the first signal contact 320c, and the first signal contact protection layer 324 is formed on the upper surface of the fourth signal contact 325 by screen printing, stencil printing, cylinder coating, inkjet coating, lamination, lithography, or other suitable methods. The 3D stacked packaging structure having conductive supporting substrates of the present invention can be completed through one of the above manufacturing process. It shall be appreciated that the above specific embodiment of the invention has been described herein for purposes of illustration rather than limiting the invention.

Figure 3B:
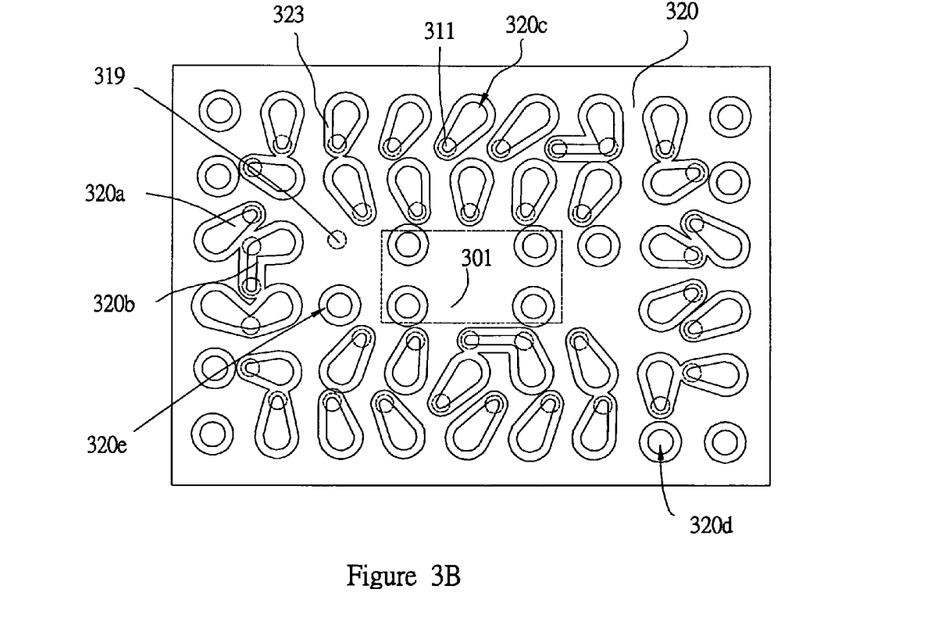
FIG. 3B is a first possible bottom view according to the first embodiment of the present invention, corresponding to FIG. 3A.

Corresponding to FIG. 3A, FIG. 3B is a first possible bottom view of the packaging unit according to the present invention, and for easy illustration, the second circuit protection layer 314 and the second signal contact protection layer 326 in FIG. 3A are omitted in this diagram. After a patterning process, the first signal channel 320a and the second signal channel 320b are formed on the supporting substrate 320, and the insulating layer 323 is filled around the signal channels. The first electronic element 301 on another side of the supporting substrate is indicated by a dotted line in this diagram, and circuit signals of the first electronic element 301 can be transmitted to the supporting substrate 320 through the second via holes 311, and are then coupled to the first signal contact 320c, a second signal contact 320d, or a third signal contact 320e through signal channels defined on the substrate. Signal contacts generated by the patterned supporting substrate 320 can be a contact, like the first signal contact 320c, for transmitting signals of the second via holes 311; they can also be like the second signal contact 320d that does not have the function for transmitting signals, and become instead a place for putting non-signal-transmitting fixation structure (UBM) in the package later on; still, they can be like the third signal contact 320e and directly transmit circuit signals of the patterned contacts which are coupled to the via holes. The patterned supporting substrate 320 can also be used as a medium for signal transmission between the via holes 311, as the second signal channel 320b is shown. The supporting substrate 320 can be connected directly to a third via hole 319 which can be a channel for transmitting ground signals on the first electronic element 301. The supporting substrate 320 is turned into a ground terminal for the first electronic element 301 by this design, and thus can enhance effectively electrical characteristic of the first packaging unit 300.

Figure 3C:
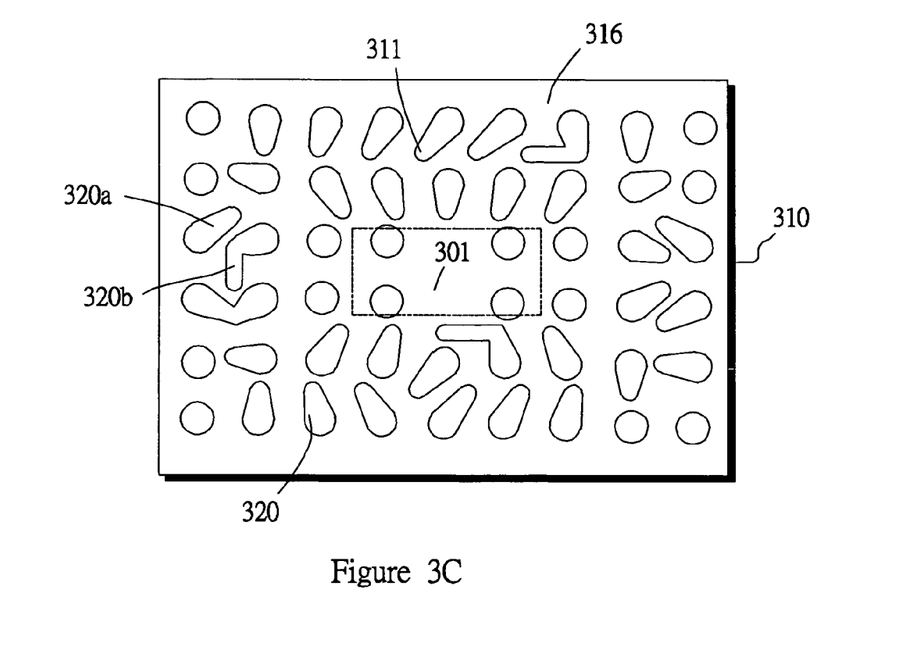
FIG. 3C is a second possible bottom view according to the first embodiment of the present invention, corresponding to FIG. 3A.

Corresponding to FIG. 3A, FIG. 3C is a second possible bottom view of the packaging unit according to the present invention, and for easy illustration, the second circuit protection layer 314 and the second signal contact protection layer 326 in FIG. 3A are omitted in this diagram. After a patterning process, only the signal channels are left on the supporting substrate 320, such as the first signal channel 320a and the second signal channel 320b, and the fillers 310 are on the back of the supporting substrate 320. Since only the materials with the signal channels of the supporting substrate 320 are retained, an adhesive layer 316 inside is exposed. An advantage of this method is the first electronic element 301 can still transmit signals to the first signal channel 320a or the second signal channel 320b through the second via holes, and the patterned supporting substrate 320 can provide a function like cooling fins, and further enhance heat-dissipating performance of the first packaging unit 300.

Figure 3D:
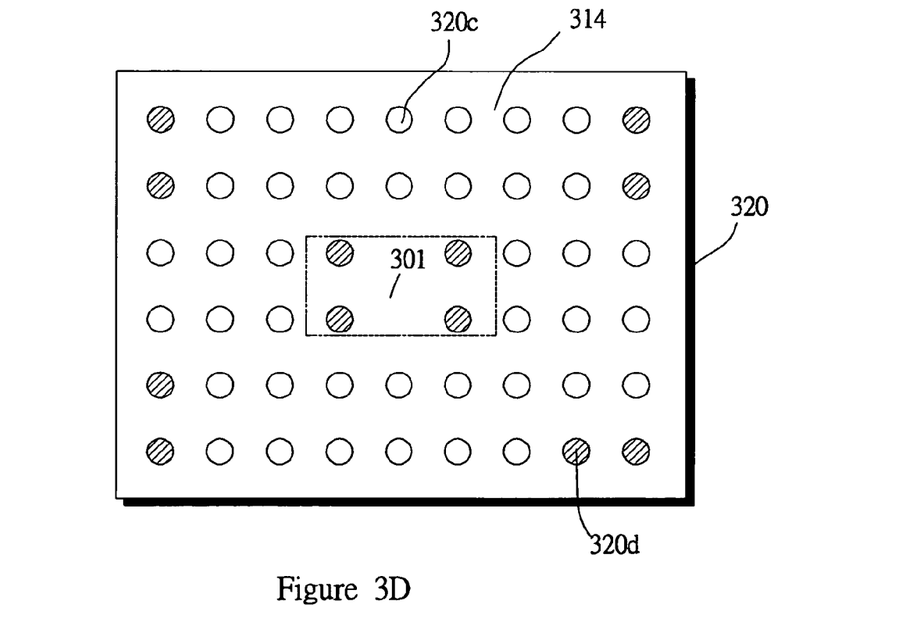
FIG. 3D is a third possible bottom view according to the first embodiment of the present invention, corresponding to FIG. 3A.

Corresponding to FIG. 3A, FIG. 3D is a third possible bottom view of the packaging unit according to the present invention. The supporting substrate 320 is covered by the second circuit protection layer 314 to give proper protection for the signal channels on the substrate, and the locations of the first signal contact 320c and the second signal contact 320d are defined to form the wafer-level packaging units having multiple microelectronic elements of the invention. It shall be appreciated that the above specific embodiment of the invention has been described herein for purposes of illustration rather than limiting the invention.

Figure 4:
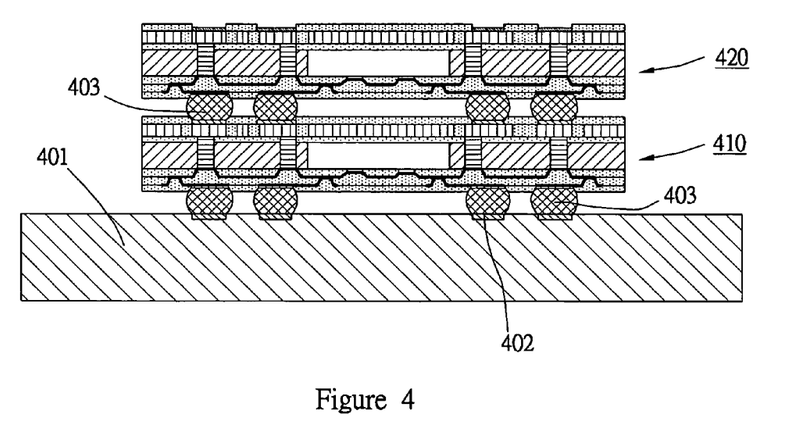
FIG. 4 is a second embodiment of the invention, and a cross-sectional schematic diagram of a first-type stacked packaging configured by the packaging units of the invention.

FIG. 4 is a second embodiment of the present invention, and a cross-sectional schematic diagram of a first-type stacked packaging configured by the packaging units of the present invention. There are signal contacts on the corresponding spots of the top and bottom surfaces of a first packaging unit 410 and of a second packaging unit 420; signal transmission fixation structures 403 (UBM) can be utilized to form signal connection among the first packaging unit 410, the second packaging unit 420, and a substrate 401, and thereby completing a stacked packaging.

Figure 5:
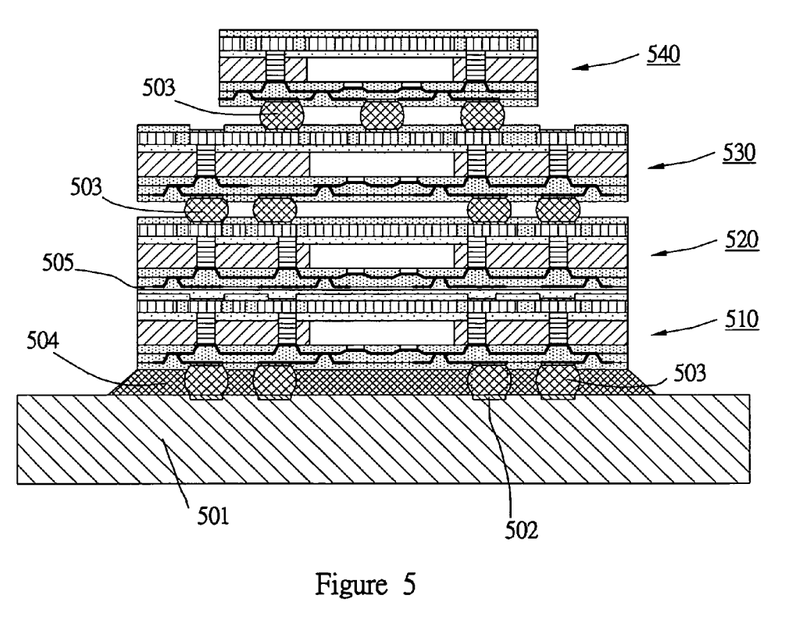
FIG. 5 is a third embodiment of the invention, and a cross-sectional schematic diagram of a second-type stacked packaging configured by the packaging units of the invention.

FIG. 5 is a third embodiment of the present invention, and a cross-sectional schematic diagram of a second-type stacked packaging configured by the packaging units of the present invention. A first packaging unit 510, a second packaging unit 520, and a third packaging unit 530 can carry out stacking with a fourth packaging unit 540 of different size and all assembled on a substrate 501. The method of signal transmission between the packaging units can employ signal transmission fixation structures 503 (UBM), or signal transmission adhesive materials 505. Moreover, in order to enhance reliability of the whole packaging structure, adhesive materials 504 can be applied to the surrounding of signal transmission fixation structures 503 to enhance the strength of the fixation structures.

Figure 6:
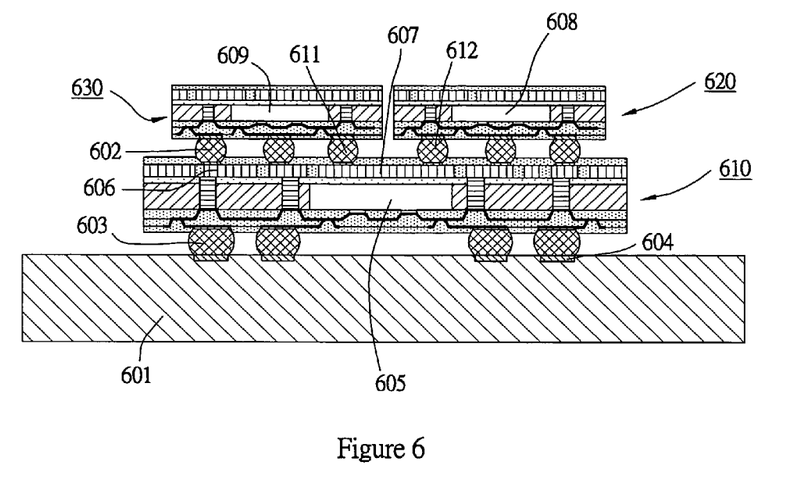
FIG. 6 is a fourth embodiment of the invention, and a cross-sectional schematic diagram of a third-type stacked packaging configured by the packaging units of the invention.

FIG. 6 is a fourth embodiment of the present invention, and a cross-sectional schematic diagram of a third-type stacked packaging configured by the packaging units of the present invention. A first packaging unit 610 can utilize first signal transmission fixation structures 602 to carry out stacking and signal connection between individual packaging units and a substrate 601 (as in FIG. 4); it can also utilize second signal transmission fixation structures 603 (UBM) to connect circuit signals from a second packaging unit 620 and a third packaging unit of smaller size, and provide a function of carrying these two packaging units. In the fourth embodiment, a second signal channel 607 can be formed on a supporting substrate 606 of the first packaging unit 610. The second signal channel 607 does not transmit signals from a first electronic element, but provides a transmission channel for a second electronic element 608 and a third electronic element 609 through a third signal transmission fixation structure 611 and a fourth signal transmission fixation structure 612 to perform signal transmission and connection with the second signal channel 607. It shall be appreciated that the above specific embodiment of the invention has been described herein for purposes of illustration rather than limiting the invention.

Figure 7:
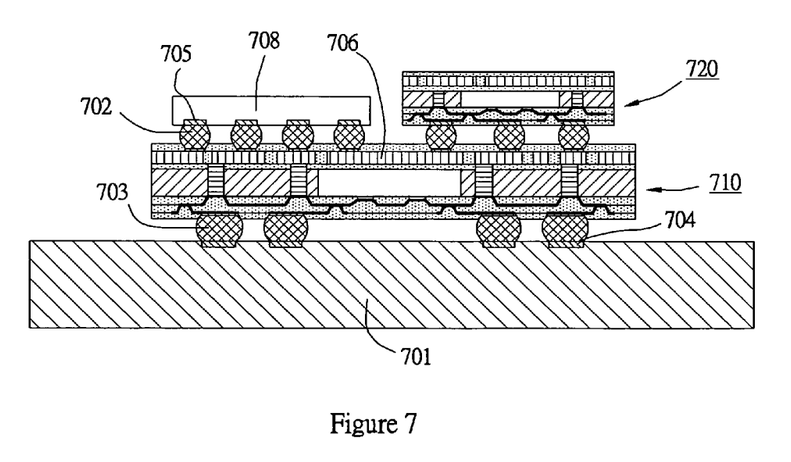
FIG. 7 is a fifth embodiment of the invention, and a cross-sectional schematic diagram of a fourth-type stacked packaging configured by the packaging units and unpackaged electronic elements of the invention.

FIG. 7 is a fifth embodiment of the present invention, and a cross-sectional schematic diagram of a fourth-type stacked packaging configured by the packaging units and unpackaged electronic elements of the invention. On a substrate 701, a first packaging unit 710 is connected thereon, and a second packaging unit 720 and a first electronic element 708 are carried on the first packaging unit 710. The electronic element 708 may be other forms of packaging units, or an unpackaged electronic element of any prior art. While stacking the packaging units, fixation structures of various sizes can be utilized to transmit circuit signals between the packaging units; as shown in the diagram, larger second signal transmission fixation structures 703 (UBM) are connected to first signal contacts 704, and smaller first signal transmission fixation structures 702 are connected to second signal contacts 705. Circuit signals can be transmitted between the second packaging unit 720 and the first electronic element 708 through a first signal channel 706.

Figure 8:
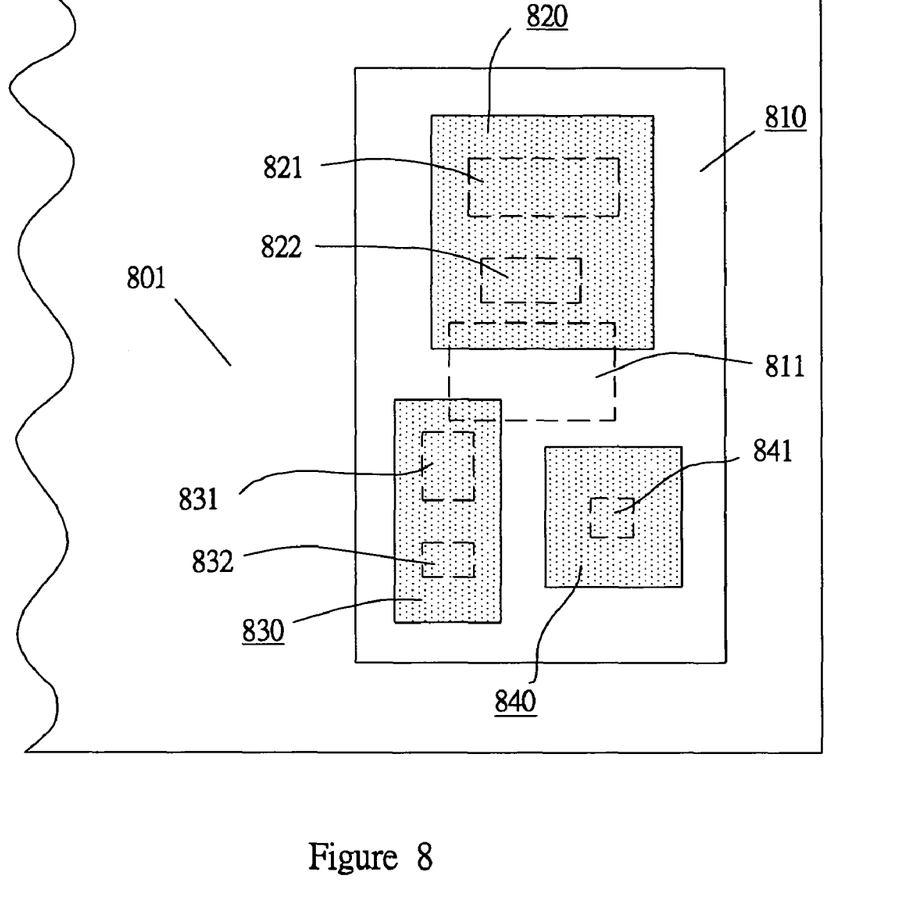
FIG. 8 is a sixth embodiment of the invention, and a top view of a fifth-type stacked packaging configured by the packaging units of the invention and other types of packaging units or electronic elements.

FIG. 8 is a sixth embodiment of the invention, and a top view of a fifth-type stacked packaging configured by the packaging units of the invention and other types of packaging units or electronic elements. Signal transmission fixation structures (not shown in FIG. 8) on a substrate 801 are utilized to fix a first packaging unit 810 on the substrate 801. On the first packaging unit 810, a second packaging unit 820, a third packaging unit 830 and a fourth packaging unit 840 are connected thereon using signal transmission fixation structures (not shown in FIG. 8). A first electronic element 811 located on the first packaging unit 810, a second electronic element 821 and a third electronic element 822 located on the second packaging unit 820, a fourth electronic element 831 and a fifth electronic element 832 located on the third packaging unit 830, and a sixth electronic element 841 located on the fourth packaging unit 840, total of six electronic elements are included in this stacked packaging. The signal contacts on the both sides of the packaging units having conductive supporting substrates of the invention can be utilized to achieve multi-chip stacking, and to form channels between electric signals of the six electronic elements depending on the requirement of practical applications.

From the foregoing, it shall be appreciated that specific embodiments of the invention have been described herein for purposes of illustration, but that various modifications and alterations may be made by those skilled in the art without deviating from the spirit and scope of the invention. Accordingly, the invention is not limited except as by the appended claims.

We claim:

1. An electronic packaging structure comprising:
   a conductive supporting substrate;
   an electronic element disposed on the surface of said supporting substrate;
   a filling zone formed around said electronic element, and at least one via hole formed within said filling zone, wherein conductive materials are filled inside said via hole or hole wall to form signal connection between the surface of said filling zone and said supporting substrate;
   signal contacts formed on a bottom side of said electronic packaging structure; and
   signal channels formed on said bottom side of said electronic packaging structure, wherein said signal channels are connected to said signal contacts and said conductive materials inside said via hole respectively to form channels between said signal contacts and said conductive materials.

2. The electronic packaging structure of claim 1, wherein said signal connection between both sides of said electronic packaging structure are through said via holes in said filling zone.

3. The electronic packaging structure of claim 1, wherein said conductive supporting substrate is a good thermal conductor, and wherein said conductive supporting substrate is coupled to ground of said electronic element.

4. The electronic packaging structure of claim 1, wherein the material of said conductive supporting substrate includes Cu, Ni, Fe, Al, Co, Au, or the combinations thereof.

5. The electronic packaging structure of claim 1, wherein said signal channels are formed on said conductive supporting substrate by machining, dry etching, wet etching or laser drilling.

6. The electronic packaging structure of claim 1, wherein said electronic element can be selected from an active electronic element, a passive electronic element, a sensing element, a testing element, a micro-electro-mechanical chip, or the combinations thereof.

7. The electronic packaging structure of claim 1, wherein said filling zone is made of thermoplastic or thermosetting materials, and said filling zone being formed by employing screen printing, stencil printing, cylinder coating, inkjet coating, lamination or lithography.

8. The electronic packaging structure of claim 1, wherein said via holes are formed by machine drilling, laser drilling, dry or wet etching.

9. The electronic packaging structure of claim 1, wherein the conductive material is metal filled inside said via holes include Sn, Ag, Au, Al, Be, Cu, Ni, Rh, W, or the combinations thereof.

10. The electronic packaging structure of claim 1, wherein protection layers for said signal contacts are formed thereon by employing screen printing, stencil printing, cylinder coating, inkjet coating, or lithography.

11. A 3D electronic packaging structure having multiple packaging units comprising:
    multiple conductive supporting substrates;
    multiple electronic elements distributed over the surfaces of said multiple conductive supporting substrates;
    multiple filling zones formed around said electronic elements, and multiple via holes formed within said filling zones, wherein conductive materials are filled inside said via holes or hole walls to form signal connections between the surfaces of said filling zones and said multiple conductive supporting substrates;
    multiple signal contacts formed on a bottom side of said electronic packaging structure;
    multiple signal channels formed on said bottom side of said electronic packaging structure, wherein said multiple signal channels are connected to said multiple signal contacts and said conductive materials inside said multiple via holes respectively to form channels between said signal contacts and said conductive materials; and
    multiple fixation structures formed on said multiple signal contacts.

12. The 3D electronic packaging structure having multiple packaging units of claim 11, wherein said multiple conductive supporting substrates are good thermal conductors, and said supporting substrates being coupling to grounds of said multiple electronic elements.

13. The 3D electronic packaging structure having multiple packaging units of claim 11, wherein the materials of said multiple conductive supporting substrates include Cu, Ni, Fe, Al, Co, Au, or the combinations thereof.

14. The 3D electronic packaging structure having multiple packaging units of claim 11, wherein said multiple conductive supporting substrates include said signal channels formed thereon by machining, dry etching, wet etching, or laser drillings.

15. The 3D electronic packaging structure having multiple packaging units of claim 11, wherein said electronic elements can be selected from an active electronic element, a passive electronic element, a sensing element, a testing element, a micro-electro-mechanical chip or the combinations thereof.

16. The 3D electronic packaging structure having multiple packaging units of claim 11, wherein said multiple filling zones are made of thermoplastic or thermosetting materials, and wherein said multiple filling zones are formed by employing screen printing, stencil printing, cylinder coating, inkjet coating, lamination or lithography.

17. The 3D electronic packaging structure having multiple packaging units of claim 11, wherein said multiple via holes are formed by machine drilling, laser drilling, plasma etching, dry etching or wet etching.

18. The 3D electronic packaging structure having multiple packaging units of claim 11, wherein the conductive materials are metals filled inside said multiple via holes include Sn, Ag, Au, Al, Be, Cu, Ni, Rh, W, or the combinations thereof.

19. The 3D electronic packaging structure having multiple packaging units of claim 11, wherein protection layers for said signal contacts are formed thereon by employing screen printing, stencil printing, cylinder coating, inkjet coating or lithography.

20. The 3D electronic packaging structure having multiple packaging units of claim 11, wherein the materials of said fixation structures include Sn, Ag, Au, Al, Be, Cu, Ni, Rh, W or the combinations thereof.

21. The 3D electronic packaging structure having multiple packaging units of claim 11, wherein non-conductive adhesive materials are filled around said fixation structures to facilitate stacking of said multiple packaging units.

* * * * *